United States Patent [19]

Kajimura et al.

[11] Patent Number: 5,036,490
[45] Date of Patent: Jul. 30, 1991

[54] MEMORY DEVICE WITH DUAL CANTILEVER MEANS

[75] Inventors: Hiroshi Kajimura, Tokyo; Takao Okada, Hachiooji, both of Japan

[73] Assignee: Olympus Optical Co., Ltd., Tokyo, Japan

[21] Appl. No.: 414,128

[22] Filed: Sep. 28, 1989

[30] Foreign Application Priority Data

Oct. 5, 1988 [JP] Japan ................. 63-251575

[51] Int. Cl.$^5$ ............................. G11C 11/21
[52] U.S. Cl. ................. 365/151; 365/118; 365/174
[58] Field of Search ............ 365/174, 151, 118, 114

[56] References Cited

U.S. PATENT DOCUMENTS

| 4,575,822 | 3/1986 | Quate . | |
| 4,760,567 | 7/1988 | Crewe | 365/118 |
| 4,826,732 | 5/1989 | Kazan et al. | 365/118 |
| 4,829,507 | 5/1989 | Kazan et al. | 365/118 |
| 4,831,614 | 5/1989 | Duerig et al. | 365/174 |
| 4,864,538 | 9/1989 | Buzak | 365/118 |
| 4,878,213 | 10/1989 | Kazan et al. | 365/118 |
| 4,907,195 | 3/1990 | Kazan et al. | 365/151 |

FOREIGN PATENT DOCUMENTS

| 247219A1 | 12/1987 | European Pat. Off. . | |
| 2426740 | 12/1974 | Fed. Rep. of Germany | 365/114 |
| 1-116941 | 5/1989 | Japan | 365/151 |
| 1-125746 | 5/1989 | Japan | 365/151 |
| 1362148 | 7/1974 | United Kingdom | 365/151 |

OTHER PUBLICATIONS

IBM Technical Disclosure Bulletin, vol. 27, No. 10B, Mar. 1985—Fast Scan Piezo Drive, pp. 5976, 5977.
IBM Technical Disclosure Bulletin, vol. 27, No. 11, Apr. 1985—Magnetostrictive Positioner, p. 6373.
D. Craston et al., High Resolution Deposition of Silver in Nafion Films with the Scanning Tunneling Microscope, Electrochemical Society Life Member—Mar. 1988, pp. 785-786.
Scanning Tunnelling Microscopes–Atomic-Scale Engineering—J. B. Pethica, vol. 332 1/28/88, p. 301.
J. Schneir et al., Tunneling Microscopy, Lithography, and Surface Diffusion on an Easily Prepared, Atomically Flat Gold Surface, pp. 717-721, J. Appl. Phys. 63(3), Feb. 1, 1988.

Primary Examiner—Joseph E. Clawson, Jr.
Attorney, Agent, or Firm—Frishauf, Holtz, Goodman & Woodward

[57] ABSTRACT

The memory device comprises a recording member in which perturbations are selectively formed, a probe for detecting the presence or absence of the perturbations, a first cantilever having the recording member at a forward end, and a second cantilever having the probe needle at a forward end. The probe is supported by the first and second cantilevers at a relative position in close proximity to and spaced from the recording member. Independent drive of the first and second cantilevers permits the probe to be scanned relatively across the recording member over a wide range.

13 Claims, 4 Drawing Sheets

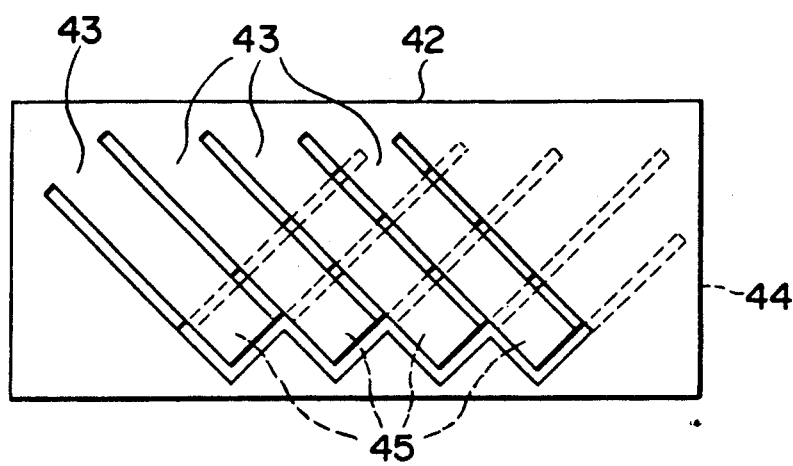
F I G. 5
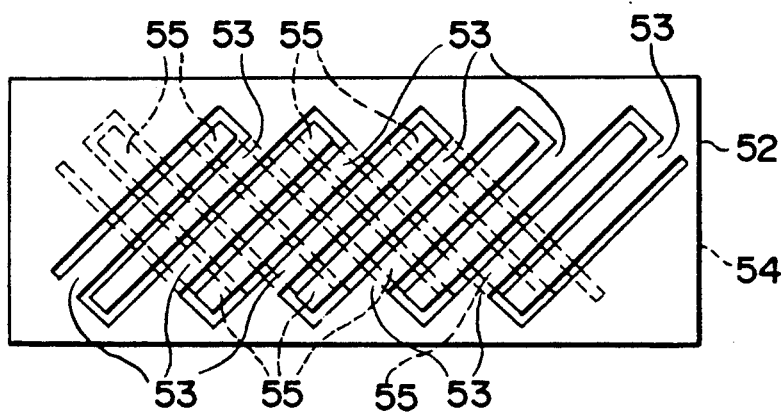
F I G. 6
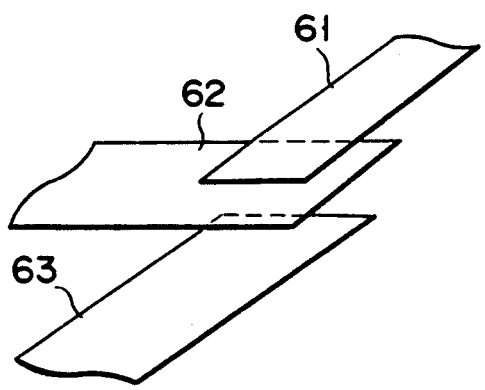
F I G. 7A
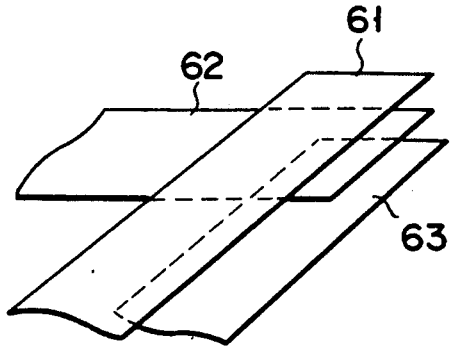
F I G. 7B

MEMORY DEVICE WITH DUAL CANTILEVER MEANS

BACKGROUND OF THE INVENTION

1. Field of the Invention

This invention relates generally to computer memory devices and relates more particularly to a memory device for reading data by measurement of the tunnel current.

2. Description of the Related Art

The scanning tunneling microscope (STM) proposed by Gerd Binnig and Heinrich Rohrer of IBM is a device for measuring, on an atomic scale, the surface contours of a sample by bringing a probe having a sharp tip of a radius of curvature of about 10 nm within some tens of angstroms of the sample surface across which the tip is scanned and by detecting variations in the tunnel current.

While the STM in its early stage was of a bulk structure including vibration isolation equipment, the advent of the micromechanical technology has decreased the device in size to minimum and removed problems associated with vibrations and thermal drifts, as achieved by a group of Stanford University people headed by Calvin F. Quate, who succeeded in forming on a silicon substrate by an IC process a cantilever type STM provided with a cantilever generally formed of piezoelectric material and which is capable of three dimensional scanning.

A STM memory which reads data by recording digital data bits by selectively forming perturbations in the surface of a substrate, measuring the tunnel current flowing between the probe and the surface of the substrate while permitting the probe to be scanned across the surface, and by detecting the presence of the perturbations, is disclosed in U.S. Pat. No. 4,575,822 to Calvin F. Quate, entitled "Method and Means for Date Storage using Tunnel Current Data Readout". The writing of surface perturbations by using a STM has been disclosed by J. Schneir, R. Sonnenfeld and others in a report entitled "Tunneling microscopy, lithography and surface diffusion on an easily prepared atomic flat gold surface". The report discloses a hole of a width of 5 nm and a mound of 10 nm in diameter. It also discloses that a continuous observation by a STM indicated that the mound had been spread out and had become flat after 21 hours.

The cantilever type STM mentioned above is applicable to this STM memory. In a cantilever type STM of a size of 5 $\mu m \times 200$ $\mu m \times 1000$ $\mu m$ in which a vaporized ZnO film is employed as a piezoelectric element, the ZnO film is elongated or contracted by 22 Å/V in a longitudinal direction, by 220 Å/V in a lateral direction and by 7700 Å/V in a direction perpendicular to the surface, so that when it is driven at a voltage of 5 V the range of horizontal scan is on the order of 110 Å $\times$ 1100 Å. Such cantilever has sufficient stroke when used in a STM for monitoring the sample surface.

When, however, the cantilever is used for a STM memory its stroke is not enough to constitute a mass memory. That is, when the recording area per bit of a STM memory is set to be 5 Å $\times$ 5 Å, the amount of data that is recorded on the horizontal scan range 110 Å $\times$ 1100 Å is on the order of 5 K bits. The amount of data that is recorded is on the order of 20 K bits even if the recording area per bit is set at 2.5 Å $\times$ 2.5 Å. Even if one-hundred STM memories are formed on a single chip thanks to an IC process, available memory capacity is only about 2 M bits and is subject to limitations to establish a mass memory.

SUMMARY OF THE INVENTION

An object of the invention is to provide a STM memory having a large recording capacity.

The memory device according to this invention comprises a recording medium; means for selectively forming perturbations in the recording medium; probe means for detecting the presence of perturbations, said probe means including a conductive probe, means for impressing a bias voltage between the probe and the recording medium to permit a tunnel current to flow between the probe and the recording medium, means for measuring the tunnel current; first movement means for moving the recording medium; and second movement means for moving the probe, the probe and recording medium being supported by the first and second means in close proximity to and spaced apart from each other, whereby the probe and recording medium perform independent movements. The recording medium substrate is formed by an IC process such as vapor deposition or a heat CVD process, by masking to cover the range of movement of the probing needle, recording media of two kinds or more may be formed on the same substrate to permit temporary memories and permanent memories to coexist.

BRIEF DESCRIPTION OF THE DRAWINGS

FIG. 5 is a diagram schematically illustrating a modification of the memory device according to this invention;

FIG. 6 is a schematic diagram of a further modification of the memory device according to this invention;

FIGS. 7A and 7B are diagrams illustrating still further modifications of the memory device of this invention;

DETAILED DESCRIPTION OF THE PREFERRED EMBODIMENTS

Figure 1:
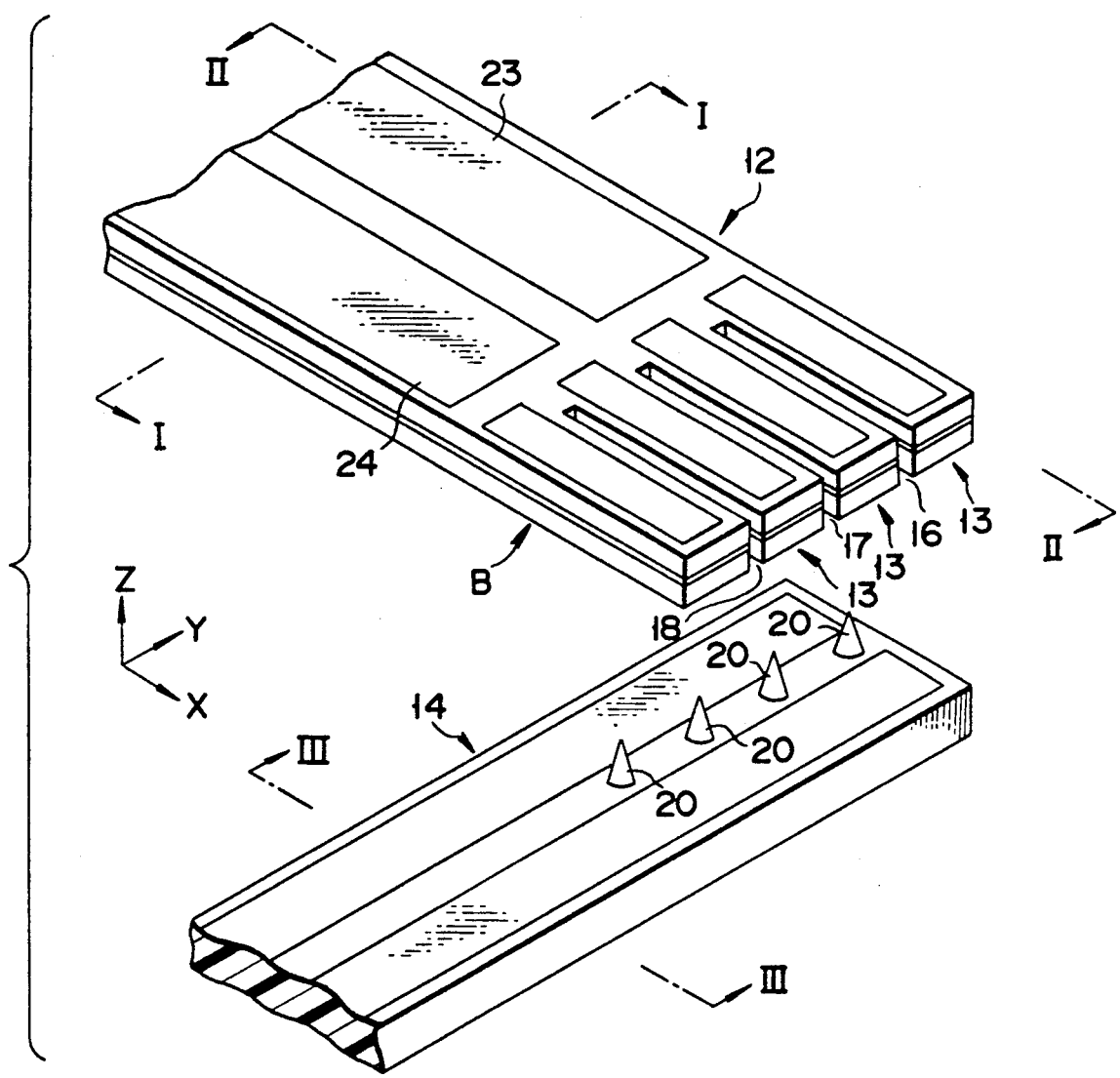
FIG. 1 is a perspective view of a part of the memory device according to this invention.
Figure 3:
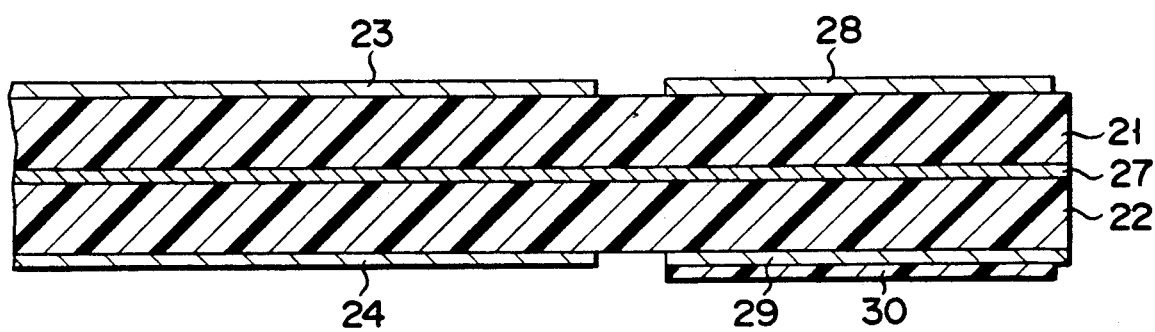
FIG. 3 is a view similar to FIG. 2 taken along the line II—II of FIG. 1.

The memory device of this invention will be described in detail with reference to the accompanying drawings. As shown in FIG. 1, the device basically comprises two cantilevers 12, 14 which oppose each other. The first cantilever 12 extends in the X direction and has at its forward end four small independent cantilevers 13 separated by three separation grooves 16, 17, 18 and which have recording members 30 on the bottom surfaces. The small cantilevers 13 are of the same structure, one example of which is shown in FIG. 3 in cross section. A second cantilever 1 having four tunnel current probes 20 at the upper forward end is positioned below the first cantilever 12 so that the probes face the respective recording media 30. The probe 20 is formed into a conical configuration by repeated processing of metal evaporation by masking.

Figure 2:
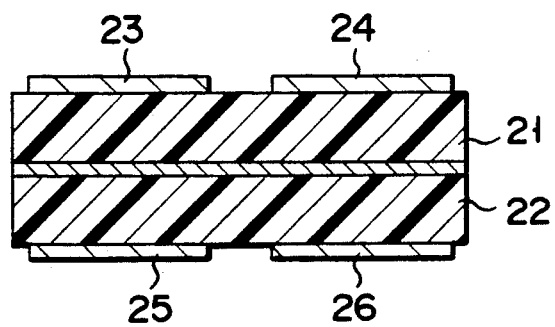
FIG. 2 is a cross section of a first cantilever taken along the line I—I of FIG. 1.

A cross section of the first cantilever 12 as taken along the line I—I of FIG. 1 is shown in FIG. 2. As is apparent from the figure, the first cantilever 12 includes ZnO layers 21, 22, on top or bottom outer surfaces carrying thereon electrodes 23, 24 and 25, 26 which are divided at an intermediate portion and run parallel to each other in the longitudinal direction of the cantilever 12. A composite structure of the electrodes 23 to 26 and the ZnO layers 21, 22 provides the cantilever 12 with a Y-direction movement. When an opposite phase voltage is applied across the two electrode pairs 23, 25 and 24, 26 in which each element of the pair opposes the other via the ZnO layers 21, 22, the ZnO layers 21, 22 interposed between one electrode pair, say, 23, 25 is elongated (or contracted) and the layers 21, 22 interposed between the other electrode pair 24, 26 is contracted (or elongated), with the result that the cantilever 12 is bent in the lateral direction as a whole to permit the recording areas to move in the Y-direction.

FIG. 3 shows a cross section of the first cantilever as taken along the line II—II of FIG. 1. The small cantilevers 13 formed in the forward end of the cantilever 12 is provided with an electrode 27 between the ZnO layers 21 and 22, an electrode 28 on its upper surface, and an electrode 29 between the bottom surface of the ZnO layer 22 and the recording member 30. Aluminum, for example, may be used for the above electrodes. The composite structure of the electrodes 27, 28, 29 and the ZnO layers 21, 22 causes the small cantilevers 13 to move in the Z-direction. When an opposite phase voltage with respect to a reference voltage applied to the electrode 27 is applied to the electrodes 28 and 29 mounted on the top and bottom surfaces of the small cantilevers 13, the ZnO layer 21 interposed between the electrodes 27, 28 is elongated (or contracted) and the ZnO layer 22 interposed between the electrodes 27, 29 is, conversely, contracted (or elongated). This causes the small cantilevers 13 to be bent vertically and as a result the recording member 30 is moved in the Z-dimension.

Figure 4:
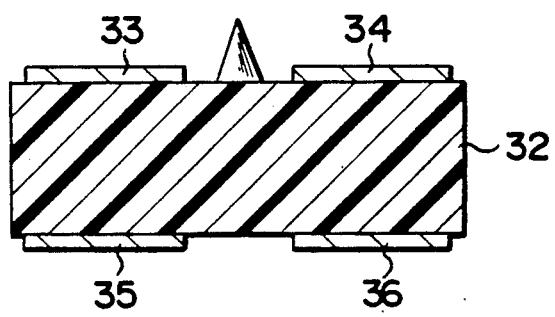
FIG. 4 is a cross sectional view of a second cantilever taken along the line III—III of FIG. 1.

As shown in FIG. 4 in cross section, the second cantilever 14 includes a ZnO layer 32 provided with electrodes 33, 34 and 35, 36 on its top and bottom surfaces to permit itself to be bent in the X-direction, the electrodes being divided substantially at an intermediate portion of the layer 32 and extending parallel in the longitudinal direction of the layer 32. When an opposite phase voltage is impressed across the electrode pairs 33, 35 and 34, 36 which oppose each other with the ZnO layer 32 therebetween, the ZnO layer interposed between one electrode pair 33, 35 is elongated (or contracted) and the ZnO layer 32 interposed between the other electrode pair 34, 36 is contracted (or elongated), thus causing the tunneling probing needle to move in the X-direction.

Each recording member 30 and probe 20 are supported such that a tunnel current may flow therebetween. The respective scans of the first and second cantilevers 12 and 14 in the Y- and X-directions permit each probe 20 to be raster scanned over the surface of each recording member 30. The raster scan is effected, for example, by alternately cyclically impressing an opposite phase voltage across the electrode pairs 23, 25 and 24, 26 of the first cantilever 12 to horizontally scan the cantilever 12 in the Y-direction, and in synchronism with the cycle of applying the voltage, by applying an opposite phase voltage to the electrode pairs 33, 35 and 34, 36 of the second cantilever 14 to cause the cantilever 14 to move in the X-direction. During raster scan, the distance between the probe 20 and the recording member 30 is maintained constant by feedback control of the Z-directional position of the small cantilevers 13. Since the tunneling needle 20 and the recording member 30 are independently driven by the first and second cantilevers, the movement in a direction where a stroke of one cantilever is short is compensated by a long stroke of the other cantilever, so that the probe 20 may be scanned across the recording member 30 over wide range. In a cantilever of a size of 5 $\mu m \times 200$ $\mu m \times 1000$ $\mu m$, a range of horizontal scan is increased at least to 1100 Å$\times$1100 Å, meaning an increase in memory capacity.

In the above embodiment, the recording members 30 are provided on the bottom surface of the small cantilevers 13 and the probe 20 on the upper surface of the second cantilever 14, it should be appreciated that the recording member may be provided on the second cantilever and the probes on the same cantilevers.

FIG. 5 illustrates a modification of the memory device according to this invention. A first rectangular piezoelectric substrate 42 is provided with a plurality of cantilevers 43 which are defined by a plurality of substantially letter U-shaped grooves, part of each of grooves being common to the adjacent grooves and whose free ends extend to the lower right corner of the figure at an angle of 45°, said cantilevers constituting a first group of comb-like cantilevers 43. Similarly, a second piezoelectric substrate 44 includes a second group of cantilevers 45 in a number and of a size equivalent to the cantilevers 43, whose free ends however extend to the lower left corner of the figure at an angle of 45°. Each of the first and second groups of cantilevers 43, 45 is provided with a plurality of electrodes formed by an IC process, not shown, to establish piezoelectric drive systems. In addition, the tunnel current probes are provided at the free end regions of one group 43 (or 45) of the cantilevers and the recording members are provided at the free end regions of the other group 45 (or 43). The first and second substrates 42, 44 face each other via a spacer unit. The probes and the recording members respectively provided at the free end regions of the first and second groups 43, 45 of cantilevers are placed in close proximity to and spaced from each other. Like in the preceding modification, the probe is scanned across the recording member over a wide range as the first and second groups 43, 45 of cantilevers are independently driven. Since each cantilever of each of the groups 43, 45 are positioned in close proximity, the memory areas can be integrated in high density.

A still further modification of the invention is shown in FIG. 6. A first rectangular substrate 52 includes a first group of cantilevers 53 which are formed by a plurality of cantilevers whose free ends extend to the upper right corner of the figure at an angle of 45° and by a plurality of cantilevers whose free ends extend to the lower left corner of the figure at an angle of 45° and which are alternately disposed along the first said plurality of cantilevers, all of the cantilevers being defined by a groove in the form of a rightwardly sloped, substantially rectangular pulse waveform. Similarly, a second substrate 54 comprises a second group of cantilevers 55 formed by a plurality of cantilevers with free ends extending to the lower right corner of the figure at an angle of 45°, which are positioned alternately along a plurality of cantilevers whose free ends extend to the upper left corner of the figure at an angle of 45°, the respective cantilevers being defined by a groove. The first and second groups 53, 55 of cantilevers are provided with electrodes, not shown, that provide piezoelectric drive systems. The first and second substrates 52, 54 face each other with a spacer unit therebetween in such a manner that the forward ends of the first group 53 of cantilevers correspond to those of the second group 55 of cantilevers. Probes are provided at the forward ends of one of the groups 53, 55 of cantilevers and recording members are provided at the forward ends of the other group of cantilevers. The probes and the recording members are so spaced that a tunnel current may flow therebetween. The first and second groups 53, 55 of cantilevers are independently driven so that the probes may be scanned across a small gap between the surfaces of the recording members.

Figure 8:
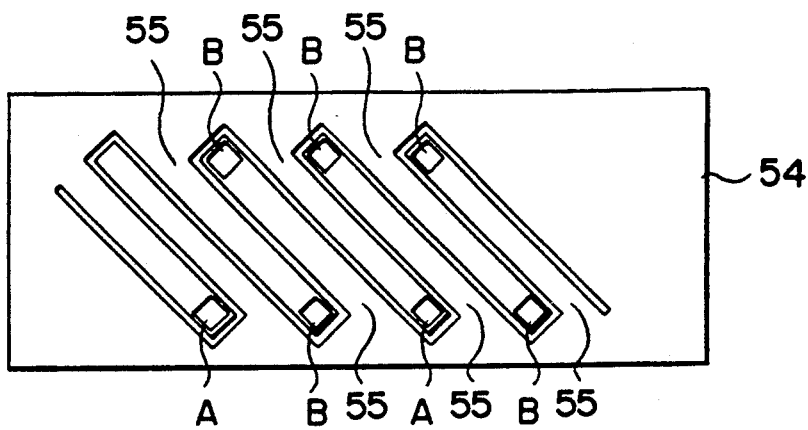
FIG. 8 is a diagram schematically showing a recording medium substrate of the memory device according to this invention, in which recording mediums of two kinds or more are formed on the same substrate.

FIG. 8 illustrates a further modification of the memory device according to this invention, which is provided with a group of cantilevers including two types or more of recording media. The group of cantilevers is similar to the group of cantilevers 55 as shown in FIG. 6 as being formed on the rectangular substrate 54, and has free end regions designated by A on which temporary recording media having an information relaxation time (a period of time after which information stored becomes unidentifiable) are formed by vapor deposition or a CVD process, and free end regions designated by B on which permanent recording media for permanently holding information are formed in a similar manner.

The temporary recording media are formed by controlling the energy band in an IC process and maintain electric charges trapped in fixed locations from the probes for a fixed period of time. The electric charges trapped into the recording media disappear after a lapse of the fixed time period from the locations in which they have been trapped, as a result of which the information stored in the location is lost. Another example of the recording medium having an information relaxation time is a metal, such as Au, which maintains information for a fixed period of time which is representative of holes and mounds formed at fixed locations by the probe.

As the permanent recording medium is used a substance whose structure is stable, such as, carbon and may be selected from those listed in Table 1 below, in which stability is defined by melting point and vapor pressure. In other words, a substance selected is capable of semipermanently maintaining holes that are formed in the permanent recording medium by the application of a voltage of 4 to 5 V to the probe.

TABLE 1

| Elements | | Temperature (°C.) | |
|---|---|---|---|
| Group | Symbol | Melting Point | Vapor pressure ~1 Pa |
| II A | Mg | 649 | 439 |
| | Sr | 769 | 537 |
| | Ba | 725 | 610 |
| VI B | Cr | 1857 | 1400 |
| I B | Cu | 1083 | 1260 |
| | Ag | 961 | 1030 |
| | Au | 1064 | 1400 |

The temporary recording media and the permanent recording media are arranged in an appropriate ratio, such as 1:10 or 1:1000, the reason being that the memory device of this invention is expected to be used for image recording and that image recording requires 1M bit per image where no compression storage of information is intended. A CD-ROM is a typical example of a permanent recording device. Images to be stored are determined by selection before a disk is fabricated into a CD-ROM. The memory device of this invention is suitable for such selection.

Figure 9:
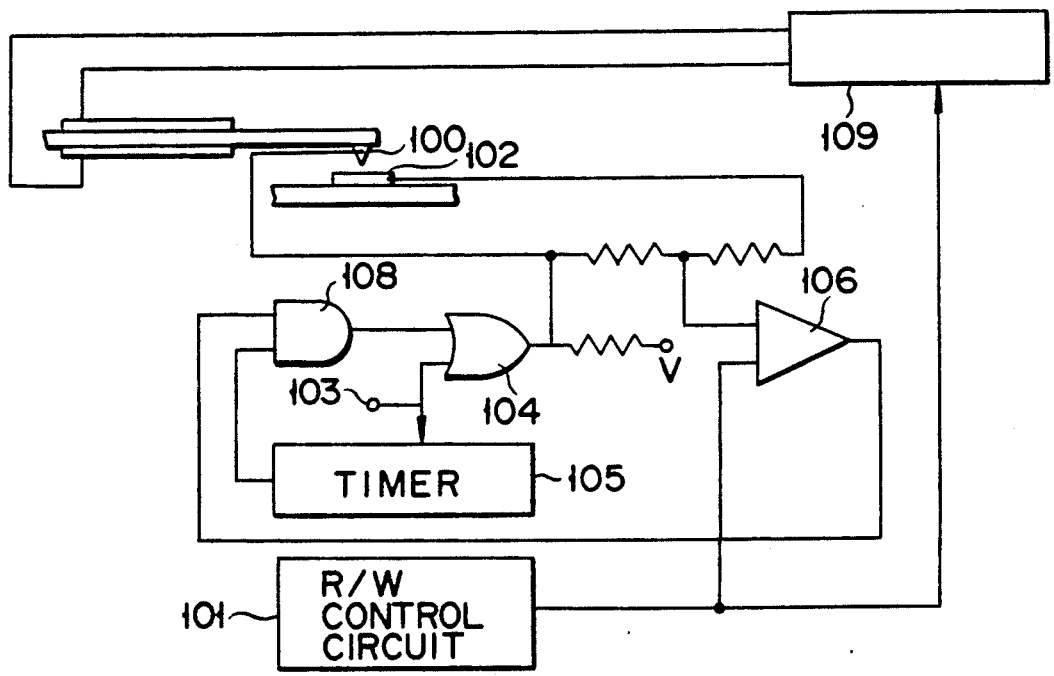
FIG. 9 is a memory circuit diagram illustrating a still further modification of the memory device according to this invention, wherein recorded information has a relaxation time.

FIG. 9 shows an example of a memory circuit arrangement of the invention in which a substance having a relaxation time is used for the recording medium.

In the writing and reading out of information, a tunnel current probe 100 is maintained above a temporary recording medium 102 by a tunnel distance (a distance between which a tunnel current is capable of flowing) by a drive circuit 109 driven in accordance with the output of a R/W control circuit 101 and is scanned at a cycle corresponding to an address for writing or reading. When information is to be written, a write pulse representing a bit array is inputted into one of the input terminals of an OR gate 104 from an information write terminal 103. Addition of the write pulse to a voltage V being impressed between the probe 100 and the recording medium 102 permits the bit array to be recorded in fixed addresses of the recording medium 102. In reading stored information, the probe 100 is scanned synchronously with the R/W control circuit 101, whereby the information stored in the fixed address is outputted from a read circuit 106 in the form of the magnitude of a tunnel current.

A timer 105 keeps the time at which the writing of information took place, in relation to the address of writing, and outputs a signal to drive a re-write circuit 108 when a re-write time set to be shorter than the relaxation time of the recording medium 102 has passed, whereby the information stored in the recording medium 102 having a relaxation time is rewritten in the medium. Since the relaxation time greatly varies depending on the substance used for the recording medium 102, the length of time to perform re-writing is selected appropriate to the substance forming the recording medium. For example, when Au is used as the medium substance, the relaxation time of a hole formed is 24 hours, the time for re-writing may be set 12 to 20 hours after the writing of information in the recording medium. While the circuit illustrated represents a read-after-write re-writing system, a copy system may likewise be employed in which a separate recording medium is used for re-writing. In the latter case, the recording medium in which information is recorded in the first place loses the information when it is left as it is without re-writing beyond the relaxation time, whereby it is automatically initialized. Regardless of whether the read-after-write system or the copy system is relied upon, the information may first be recorded in a semiconductor memory buffer and writing may be effected with a delay of time.

Figure 10:
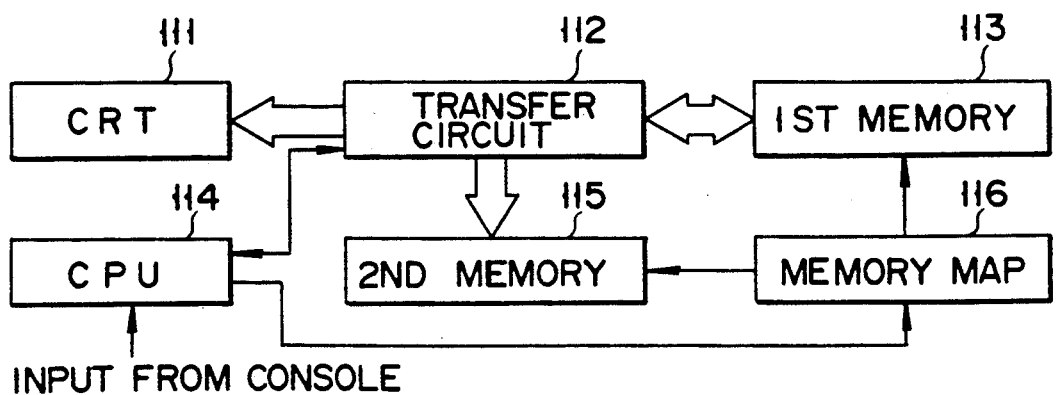
FIG. 10 is a block diagram showing a still further modification of the memory device according to this invention, which provides a combination of the temporary memory circuit of FIG. 9 and a permanent memory circuit in which a recording medium of a second type serves as a medium for permanent information recording.

FIG. 10 illustrates a block diagram of a further modification of the memory device according to this invention which comprises a first memory section using a recording medium having a relaxation time and a second memory section for permanently recording information.

An input from a console is inputted into a memory map 116 via a CPU 114. The memory map 116 constitutes a rewritable memory circuit using a semiconductor memory and indicates the status of use of memory blocks (corresponding to tracks or sectors of a disk) for storing bit arrays in the first and second memories 113 and 115. Data temporarily retained in the first memory 113 on the basis of the memory map 116, i.e., image data, is transferred by a transfer circuit 112 and displayed on a CRT 111. The transfer circuit 112 transfers the data in the first memory 113 to the second memory 115 and is also used to transfer the data to a CRT display buffer not shown prior to transferring the data to the second memory 115, thereby to confirm transfer of the data. Further, the transfer circuit 112 may have a function to compress image data to be sent to the second memory 115. The course of action desired to be taken may be displayed on the CRT 111 to determine whether the data in the first memory 113 is to be retained in the first memory as it is, or to be erased from the memory 113, or to be permanently recorded in the second memory 115 and to be erased from the first memory 113. When the data is to be erased from the first memory 113, the corresponding region of the first memory 113 is initialized by the passage of time by disallowing the data in the corresponding region of the first memory 113 to be re-written into the region.

FIGS. 7A and 7B illustrate still further modifications of the memory device according to this invention. Three cantilevers 61, 62, 63 driven by piezoelectric elements are superimposed one on top of the other with spacings at respective forward ends. The top and bottom cantilevers 61, 63 are adapted to be moved by piezoelectric elements in a horizontal plane, while the middle cantilever 62 is adapted to be moved in a horizontal plane as well as in a vertical plane. Two surfaces of the cantilevers that face each other at respective forward ends to make a pair, i.e., the bottom surface at the forward end of the cantilever 61 and the upper surface at the forward end of the cantilever 62, and the bottom surface at the forward end of the cantilever and the upper surface at the forward end of the cantilever 63, are provided with a probe at one surface of the pair and with a recording member at the other surface so that the probe and the recording member face each other with a gap therebetween. A memory formed by three cantilevers provides memory capacity two times greater in the same occupied space than a memory formed by two cantilevers.

In the foregoing modifications or embodiments of the invention, the writing and readout of digital data bits may be performed by the method disclosed in U.S. Pat. No. 4,575,822. For example, the probe may be brought into physical contact at a fixed position with a surface of a recording member having an insulating layer. The needle and the recording member may then be biased at a sufficient magnitude of voltage to permit electrons to trap into the insulating layer, whereby the writing of digital data bits is performed. Further, the recording member in which electrons are selectively trapped and the probe supported at a position close to the recording member are applied by a bias voltage, and the probe is scanned while monitoring the tunnel current flowing between it and the recording member to permit digital data bits to be read by detecting the presence of the trapped electrons from variations in the tunnel current.

What is claimed is:

1. A memory device comprising:
   a recording medium;
   means for selectively forming perturbations in the recording medium;
   probe means for detecting the presence of the perturbations, the probe means including a conductive probe, means for applying a bias voltage between the probe and the recording medium to permit a tunnel current to flow between the probe and the recording medium, and means for measuring the tunnel circuit;
   first movement means, including a first cantilever, for moving the recording medium; and
   second movement means, including a second cantilever, for moving the probe, the first and second movement means being so positioned in close proximity to and spaced from each other as to make relative movement.

2. The memory device according to claim 1, in which the first cantilever is mounted perpendicular to the second cantilever.

3. The memory device according to claim 1, in which one of the first and second cantilevers further comprises a plurality of cantilevers at a forward end portion thereof, which move in a direction perpendicular to the scanning plane.

4. The memory device according to claim 1, in which the first and second movement means comprise a group of cantilevers formed on the same substrate.

5. The memory device according to claim 4, in which the group of cantilevers is in the form of a comb.

6. The memory device according to claim 1, further comprising a plurality of pairs of a probe and a recording medium and in which one of the first and second movement means is formed by a common cantilever.

7. A memory device comprising:
   a substrate;
   first and second recording media mounted on said substrate;
   means for selectively forming perturbations in said first and second recording media;
   probe means for detecting the presence of the perturbations, said probe means including at least one conductive probe which scans one of said first and second recording media, and said probe means further including means for applying a bias voltage between said probe and said one of said first and second recording media to permit a tunnel current to flow between said probe and said one of said first and second recording media, and means for measuring the tunnel current;
   first movement means, including a first cantilever, for moving the recording medium; and
   second movement means, including a second cantilever, for moving said probe, the first and second movement means being so positioned in close proximity to and spaced from each other as to make relative movements.

8. The memory device according to claim 7, in which said first recording medium has a property whereby the perturbations formed therein in fixed locations decrease with time, and said second recording medium has a property whereby the perturbations formed therein in fixed locations are permanently retained.

9. The memory device according to claim 8, in which said first recording medium is made of a face-centered cubic lattice metal and said second recording medium is made of carbon.

10. The memory device according to claim 8, further comprising means for re-writing the perturbations formed in said first recording medium into said first recording medium before the perturbations are lost.

11. The memory device according to claim 8, further comprising means for transferring the perturbations formed in said first recording medium to said second recording medium; and means for confirming the disappearance of the perturbations formed in said first recording medium and providing a region from which the perturbations disappeared as a region in which new information is written.

12. The memory device according to claim 1, wherein at least one of said cantilevers has a bimorph shape.

13. The memory device according to claim 7, wherein at least one of said cantilevers has a bimorph shape.

* * * * *